United States Patent
Yu et al.

(10) Patent No.: US 11,411,080 B2
(45) Date of Patent: Aug. 9, 2022

(54) HETEROJUNCTION BIPOLAR TRANSISTOR AND METHOD FOR FORMING THE SAME

(71) Applicant: WIN SEMICONDUCTORS CORP., Taoyuan (TW)

(72) Inventors: Chien-Rong Yu, Taoyuan (TW); Shu-Hsiao Tsai, Taoyuan (TW); Jui-Pin Chiu, Taoyuan (TW); She-Hsin Hsiao, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 40 days.

(21) Appl. No.: 17/141,441

(22) Filed: Jan. 5, 2021

(65) Prior Publication Data

US 2022/0216303 A1     Jul. 7, 2022

(51) Int. Cl.
| | |
|---|---|
| *H01L 29/08* | (2006.01) |
| *H01L 29/66* | (2006.01) |
| *H01L 29/423* | (2006.01) |
| *H01L 29/10* | (2006.01) |
| *H01L 29/737* | (2006.01) |

(52) U.S. Cl.
CPC ...... *H01L 29/0821* (2013.01); *H01L 29/1004* (2013.01); *H01L 29/42304* (2013.01); *H01L 29/66242* (2013.01); *H01L 29/737* (2013.01)

(58) Field of Classification Search
CPC ............ H01L 29/0821; H01L 29/1004; H01L 29/42304; H01L 29/66242; H01L 29/737
See application file for complete search history.

(56) References Cited

U.S. PATENT DOCUMENTS

| | | | |
|---|---|---|---|
| 10,490,639 B2 | 11/2019 | Tao et al. | |
| 2001/0023947 A1* | 9/2001 | Gutierrez-Aitken | ......................... H01L 29/7371 257/E29.189 |
| 2019/0305094 A1* | 10/2019 | Tao | ...................... H01L 29/1004 |

* cited by examiner

*Primary Examiner* — Syed I Gheyas
(74) *Attorney, Agent, or Firm* — McClure, Qualey & Rodack, LLP

(57) ABSTRACT

A heterojunction bipolar transistor includes a bottom sub-collector layer formed over a substrate. The heterojunction bipolar transistor also includes an upper sub-collector layer formed over the bottom sub-collector layer. The heterojunction bipolar transistor also includes a collector layer formed over the upper sub-collector layer. The heterojunction bipolar transistor also includes a base layer formed over the collector layer. The heterojunction bipolar transistor also includes an emitter layer formed over the base layer. The heterojunction bipolar transistor also includes a passivation layer covering the bottom sub-collector layer, the upper sub-collector layer, the collector layer, the base layer, and the emitter layer. The heterojunction bipolar transistor also includes a collector electrode that covers the portion of the passivation layer that is over the sidewall of the upper sub-collector layer.

20 Claims, 13 Drawing Sheets

HETEROJUNCTION BIPOLAR TRANSISTOR AND METHOD FOR FORMING THE SAME

BACKGROUND

Technical Field

The disclosure relates to a semiconductor structure, and more particularly to a heterojunction bipolar transistor and a method for forming a heterojunction bipolar transistor.

Description of the Related Art

A heterojunction bipolar transistor (HBT) is a bipolar junction transistor with two different materials that have different energy band-gaps. Heterojunction bipolar transistors are widely used in the industry due to their many advantages, which include a low base resistance, a high cut-off frequency, a high efficiency, more design flexibility, and a low cost.

The collector resistance of HBT may impact the maximum operation frequency and the overall performance of the device. The collector resistance of HBT includes external sub-collector resistance, internal sub-collector resistance, and access resistance. In order to achieve high efficiency, high output power, and high linearity, the overall collector resistance of an HBT needs to be reduced further.

Although existing heterojunction bipolar transistors have generally been adequate for their intended purposes, they have not been entirely satisfactory in all respects, and need to be improved. This is especially true of the reduction of the collector resistance.

BRIEF SUMMARY

The present disclosure provides a heterojunction bipolar transistor including a bottom sub-collector layer formed over a substrate. The heterojunction bipolar transistor also includes an upper sub-collector formed over the bottom sub-collector layer. The heterojunction bipolar transistor also includes a collector layer formed over the upper sub-collector. The heterojunction bipolar transistor also includes a base layer formed over the collector layer. The heterojunction bipolar transistor also includes an emitter layer formed over the base layer. The heterojunction bipolar transistor also includes a passivation layer covering the bottom sub-collector layer, the upper sub-collector layer, the collector layer, the base layer, and the emitter layer. The heterojunction bipolar transistor also includes a collector electrode that covers the portion of the passivation layer that is over the sidewall of the upper sub-collector layer.

The present disclosure also provides a heterojunction bipolar transistor including a bottom sub-collector layer formed over a substrate. The heterojunction bipolar transistor also includes a first mesa formed over the bottom sub-collector layer. The first mesa includes a base layer disposed over a collector layer, and the collector layer is disposed over an upper sub-collector layer. The heterojunction bipolar transistor also includes a second mesa formed over the first mesa. The second mesa includes an emitter layer. The heterojunction bipolar transistor also includes a passivation layer covering the first mesa and the second mesa. The heterojunction bipolar transistor also includes a collector electrode through the passivation layer. The collector electrode covers the passivation layer over a sidewall of the first mesa.

The present disclosure further provides a method for forming a heterojunction bipolar transistor. The method includes forming a bottom sub-collector layer over a substrate. The method also includes forming an upper sub-collector layer over the bottom sub-collector layer. The method also includes forming a collector layer over the upper sub-collector layer. The method also includes forming a base layer over the collector layer. The method also includes forming an emitter layer over the base layer. The method also includes conformally forming a passivation layer covering the bottom sub-collector layer, the upper sub-collector layer, the collector layer, the base layer, and the emitter layer. The method also includes forming a collector electrode in contact with the bottom sub-collector layer and the upper sub-collector layer. The passivation layer over the sidewall of the upper sub-collector layer is embedded in the collector electrode.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
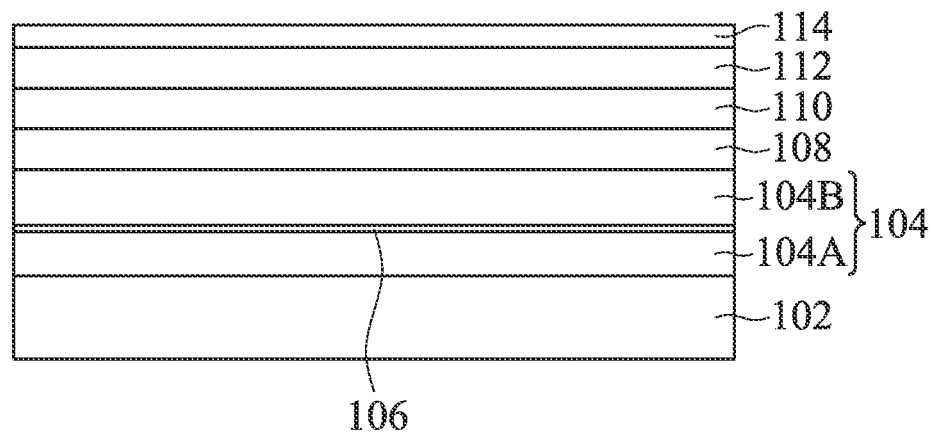
FIGS. 1A-1G are cross-sectional representations of various stages of forming a heterojunction bipolar transistor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a heterojunction bipolar transistor. By forming a collector electrode that covers the portion of the passivation layer that is over the sidewall of the base mesa, there may be less peeling of the passivation layer. The risk of misalignment of forming the collector electrode may also be reduced. In addition, since the passivation layer is formed between the collector electrode and the sidewall of the base mesa, unnecessary Schottky contact may also be prevented.

FIGS. 1A-1G are cross-sectional representations of various stages of forming a heterojunction bipolar transistor 10a in accordance with some embodiments. As shown in FIG. 1A, the heterojunction bipolar transistor 10a includes a substrate 102. The substrate 102 may be a semiconductor substrate. Moreover, the substrate 102 may include III-V semiconductors such as GaN, AlGaN, AlN, GaAs, AlGaAs, InP, InAlAs, InGaAs, or a combination thereof. In some embodiments, the substrate 102 includes undoped GaAs.

Next, a bottom sub-collector layer 104A is formed on the substrate 102. In some embodiments, the bottom sub-collector layer 104A includes a III-V semiconductor having a first conductivity type. In some other embodiments, the bottom sub-collector layer 104A includes a III-V semiconductor having a second conductivity type. The second conductivity type is opposite to the first conductivity type. In some embodiments, the first conductivity type is n-type. The bottom sub-collector layer 104A may include III-V semiconductors such as GaN, AlGaN, AlN, GaAs, AlGaAs, InP, InAlAs, InGaAs, or a combination thereof. In some embodiments, the bottom sub-collector layer 104A is an n-type GaAs layer which may be doped by Si, Se, and Te. In some embodiments, the doping concentration of the bottom sub-collector layer 104A is from 1e18 $cm^{-3}$ to 1e20 $cm^{-3}$. In some embodiments, the doping concentration of the bottom sub-collector layer 104A is 5e18 $cm^{-3}$. With doping concentration of this order, it may be easier to form an ohmic contact between the bottom sub-collector layer 104A and subsequently formed collector electrode. If the doping concentration of the bottom sub-collector layer 104A is too high, the dopant may not be activated completely and the reliability may be worse. If the doping concentration of the bottom sub-collector layer 104A is too low, an ohmic contact may not be formed between the bottom sub-collector layer 104A and subsequently formed collector electrode. In some embodiments, the bottom sub-collector layer 104A may have a thickness of between 50 nm and 1500 nm. In some embodiments, the bottom sub-collector layer 104A has a thickness of between 100 nm and 1000 nm. In some embodiments, the bottom sub-collector layer 104A has a thickness of between 100 nm and 800 nm. If the bottom sub-collector layer 104A is too thick, it may be difficult for isolation by implantation. If the bottom sub-collector layer 104A is too thin, the collector resistance may increase. The bottom sub-collector layer 104A may be formed on the substrate 102 by molecular-beam epitaxy (MBE), metalorganic chemical vapor deposition (MOCVD), chemical vapor deposition (CVD), hydride vapor phase epitaxy (HVPE), another suitable method, or a combination thereof. The bottom sub-collector layer 104A may be doped by in-situ doping.

Next, an etch stop layer 106 is optionally formed on the bottom sub-collector layer 104A. The etch stop layer 106 may include InGaP, InGaAs, GaAsP, AlGaAs, InAlAs, GaSb or a combination thereof. In some embodiments, the etch stop layer 106 has a doping concentration in the same order with the doping concentration of the bottom sub-collector layer 104A. In some embodiments, the doping concentration of the etch stop layer 106 is from 1e18 $cm^{-3}$ to 1e20 $cm^{-3}$. If the doping concentration of the etch stop layer 106 is too high, the dopant may not be activated completely and the reliability may be worse. If the doping concentration of the etch stop layer 106 is too low, the collector resistance may increase. In some embodiments, the etch stop layer 106 may have a thickness of between 5 nm and 200 nm. In some embodiments, the etch stop layer 106 has thickness of between 5 nm and 50 nm. If the etch stop layer 106 is too thick, the collector resistance may increase. If the etch stop layer 106 is too thin, it may not be sufficient to make subsequent etching process stop. The etch stop layer 106 may be formed by molecular-beam epitaxy (MBE), metalorganic chemical vapor deposition (MOCVD), chemical vapor deposition (CVD), hydride vapor phase epitaxy (HVPE), another suitable method, or a combination thereof. The etch stop layer 106 may be doped by in-situ doping.

Next, an upper sub-collector layer 104B is formed on the etch stop layer 106 (if there is one) or the bottom sub-collector layer 104A. In some embodiments, the upper sub-collector layer 104B may have a thickness of between 50 nm and 1500 nm. In some embodiments, the upper sub-collector layer 104B has a thickness of between 100 nm and 1000 nm. In some embodiments, the upper sub-collector layer 104B has a thickness of between 100 nm and 800 nm. In some embodiments, the thickness of the upper sub-collector layer 104B and the thickness of the bottom sub-collector layer 104A are substantially the same. In some embodiments, the upper sub-collector layer 104B is in direct contact with the subsequently formed collector electrode. In some embodiments, the doping concentration of the upper sub-collector layer 104B is from 1e18 cm$^{-3}$ to 1e20 cm$^{-3}$. In some embodiments, the doping concentration of the upper sub-collector layer 104B is 5e18 cm$^{-3}$. With doping concentration of this order, it may be easier to form an ohmic contact between the upper sub-collector layer 104B and the subsequently formed collector electrode. If the doping concentration of the upper sub-collector layer 104B is too high, the dopant may not be activated completely and the reliability may be worse. If the doping concentration of the upper sub-collector layer 104B is too low, an ohmic contact may not be formed between the upper sub-collector layer 104B and subsequently formed collector electrode. In some embodiments, the doping concentrations of the upper sub-collector layer 104B and the bottom sub-collector layer 104A are the same. In some other embodiments, the dopant concentration of the upper sub-collector layer 104B and the bottom sub-collector layer 104A are different. As long as the dopant concentrations are high enough, ohmic contact may be formed between the upper sub-collector layer 104B, the bottom sub-collector layer 104A, and the subsequently formed collector electrode. Materials and processes used to form the upper sub-collector layer 104B may be similar to, or the same as, those used to form the bottom sub-collector layer 104A described previously and are not repeated herein for brevity. In some embodiments, the upper sub-collector layer 104B is an n-type GaAs layer which may be doped by Si, Se, and Te.

It should be noted that since the formation of the etch stop layer 106 is optional, the upper sub-collector layer 104B and the bottom sub-collector layer 104A may be formed of the same material at the same time, which may reduce production cost and time. The upper sub-collector layer 104B and the bottom sub-collector layer 104A may be referred to as the sub-collector layer 104.

Next, a collector layer 108 is formed on the upper sub-collector layer 104B. In some embodiments, the collector layer 108 includes a III-V semiconductor having a first conductivity type. The collector layer 108 may include III-V semiconductors such as GaN, AlGaN, AlN, GaAs, AlGaAs, InP, InAlAs, InGaAs, GaSb, InGaP, InGaAsP, or a combination thereof. In some embodiments, the collector layer 108 is an n-type GaAs layer. The collector layer 108 may be formed by molecular-beam epitaxy (MBE), metalorganic chemical vapor deposition (MOCVD), chemical vapor deposition (CVD), hydride vapor phase epitaxy (HVPE), another suitable method, or a combination thereof. In some embodiments, the doping concentration of the collector layer 108 is from 0 cm$^{-3}$ to 1e18 cm$^{-3}$. In some embodiments, the doping concentration of the collector layer 108 is from 1e14 cm$^{-3}$ to 1e18 cm$^{-3}$. In some embodiments, the doping concentration of the collector layer 108 is from 1e14 cm$^{-3}$ to 1e17 cm$^{-3}$. In some embodiments, the doping concentration of the collector layer 108 is from 1e14 cm$^{-3}$ to 3e17 cm$^{-3}$. In some embodiments, the doping concentration of the collector layer 108 is from 1e14 cm$^{-3}$ to 5e17 cm$^{-3}$. In some embodiments, the doping concentration of the collector layer 108 is from 1e14 cm$^{-3}$ to 8e17 cm$^{-3}$. The collector layer 108 may be a multi-layer structure with different doping concentration. Since the doping concentration of the collector layer 108 is lower than the upper sub-collector layer 104B, if the subsequently formed collector electrode is in contact with the collector layer 108, a Schottky contact, not an ohmic contact, may be formed between the collector layer 108 and the subsequently formed collector electrode.

Next, a base layer 110 is formed over the collector layer 108. In some embodiments, the base layer 110 includes a III-V semiconductor having a second conductivity type. The base layer 110 may include III-V semiconductors such as GaN, AlGaN, AlN, GaAs, AlGaAs, InP, InAlAs, InGaAs, GaSb or a combination thereof. In some embodiments, the base layer 110 is a highly doped p-type GaAs layer which may be doped by C, Mg, Zn, Ca, Be, Sr, Ba, and Ra. The doping concentration of the base layer 110 may be in a range of between 1e18 cm$^{-3}$ to 1e20 cm$^{-3}$. In some embodiments, the base layer 110 has a graded doping concentration. The base layer 110 with the graded doping concentration may improve the transit time and/or the base resistance. The base layer 110 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Next, an emitter layer 112 is formed on the base layer 110. In some embodiments, the emitter layer 112 includes a III-V semiconductor having a first conductivity type. The emitter layer 112 may include III-V semiconductors such as GaN, AlGaN, AlN, GaAs, AlGaAs, InP, InAlAs, InGaAs, or a combination thereof. In some embodiments, the emitter layer 112 is an n-type InGaP layer. In some embodiments, the emitter layer 112 is an AlGaAs layer with a wide band gap. In some embodiments, the emitter layer 112 is an n-type AlGaAs layer with a high doping concentration in a range between 1e17 cm$^{-3}$ to 1e19 cm$^{-3}$. The high doping concentration of the AlGaAs emitter layer 112 may reduce the emitter resistance while keeping the advantages resulting from the wide band gap of the AlGaAs emitter layer 112. The emitter layer 112 may be a multi-layer structure. In some embodiments, the emitter layer 112 includes an n-type InGaP layer at the bottom and an n-type GaAs layer at the top (not shown). In some embodiments, the material of the emitter layer 112 and the material of the base layer 110 are different materials with different band gaps. Therefore, a heterojunction may be formed at the interface between the emitter layer 112 and the base layer 110. The emitter layer 112 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Next, an emitter cap layer 114 is formed on the emitter layer 112. In some embodiments, the emitter cap layer 114 includes a III-V semiconductor having a first conductivity type. The emitter cap layer 114 may include III-V semiconductors such as GaN, AlGaN, AlN, GaAs, AlGaAs, InP, InAlAs, InGaAs, or a combination thereof. In some embodiments, the emitter cap layer 114 is a highly doped n-type InGaAs layer which may help to form ohmic contact between the emitter cap layer 114 and the subsequently formed emitter electrode. The emitter cap layer 114 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Figure 1B:
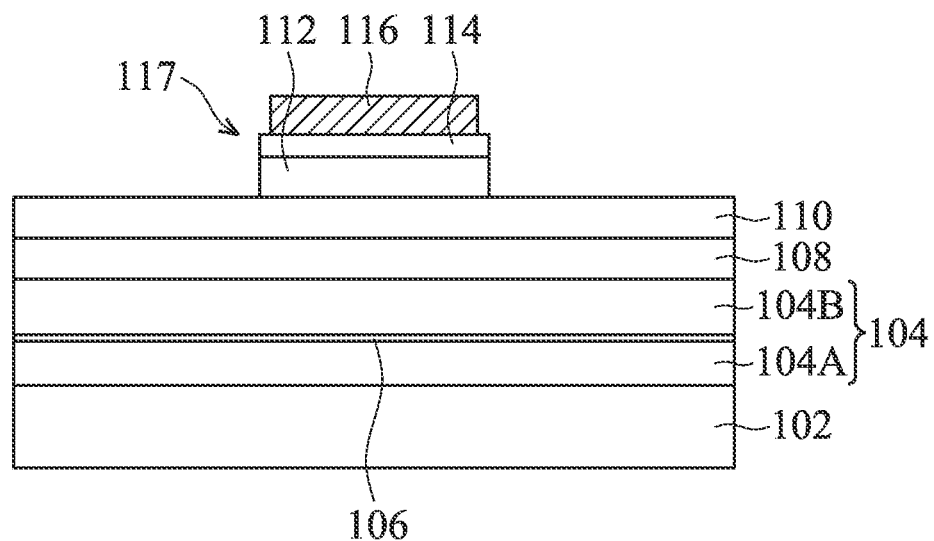

Next, as shown in FIG. 1B, an emitter electrode 116 is formed on the emitter cap layer 114. The emitter electrode 116 may include Ti, Al, Au, Pd, Pt, Cu, W, other suitable metal, its alloy, or a combination thereof. An emitter electrode material may be formed on the emitter cap layer 114 first by electroplating, sputtering, resistive heating evaporation, physical vapor deposition (PVD), chemical vapor deposition (CVD), atomic layer deposition (ALD), another suitable method, or a combination thereof. The electrode material is then patterned by a photolithography and an etching process, and the emitter electrode 116 is formed.

After the emitter electrode 116 is formed, the emitter cap layer 114 and the emitter layer 112 are then patterned by a photolithography and an etching process, as shown in FIG. 1B, in accordance with some other embodiments. The patterning process may include photoresist coating (such as spin-on coating), soft baking, mask aligning, pattern exposure, post-exposure baking, photoresist development, rinsing and drying (such as hard baking), other suitable techniques, or a combination thereof. The etching process may include a dry etching process (such as reactive ion etching (ME) or an anisotropic plasma etching method), wet etching, or a combination thereof. As a result, an emitter mesa 117 including the emitter cap layer 114 and the emitter layer 112 is formed.

Figure 1C:
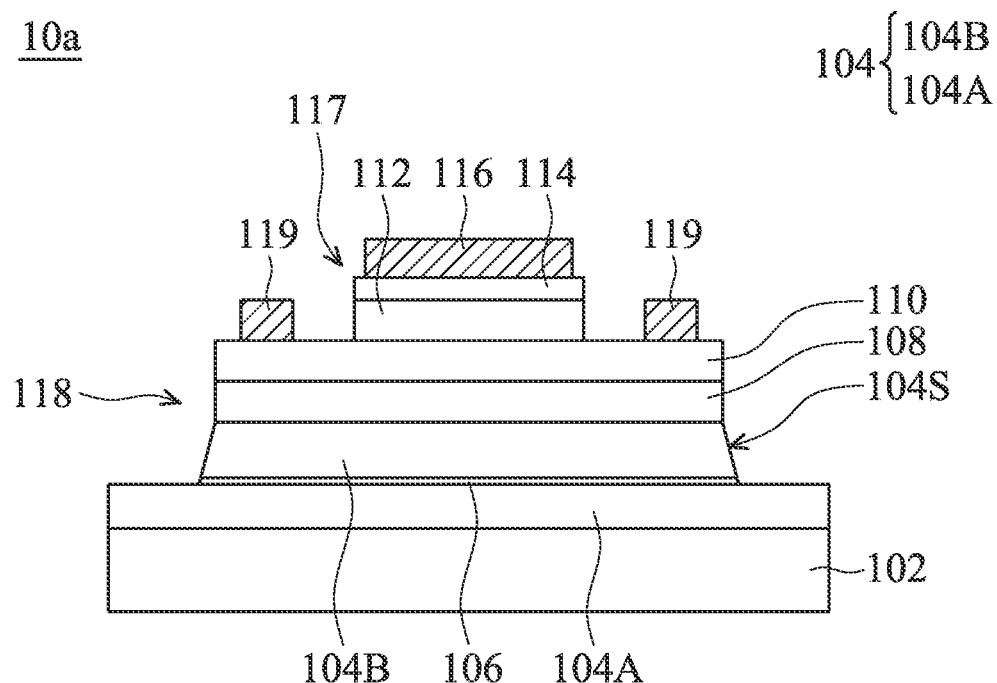

Next, as shown in FIG. 1C, the base layer 110, the collector layer 108, the upper sub-collector layer 104B are patterned by a photolithography and an etching process to form a base mesa 118 including the base layer 110, the collector layer 108, and the upper sub-collector layer 104B. As shown in FIG. 1C, the etching stops at the etch stop layer 106. Therefore, the etch stop layer 106 may protect the bottom sub-collector layer 104A from being over-etched, resulting in a uniform thickness of the bottom sub-collector layer 104A.

The etching of the base layer 110 and the collector layer 108 and the etching of the upper sub-collector layer 104B may be different. For example, the etching of the base layer 110 and the collector layer 108 may be an anisotropic process such as a dry etching process. The dry etching process may be performed by an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), bromine-containing gas (such as HBr and/or $CHBR_3$), iodine-containing gas, other suitable gas and/or plasma, or a combination thereof. Therefore, the base layer 110 and the collector layer 108 may have a vertical sidewall perpendicular to the bottom surface of the collector layer 108. On the other hand, the etching of the upper sub-collector layer 104B may be an isotropic process such as a wet etching process. The wet etching process may be performed in wet etching etchant including diluted hydrofluoric acid (DHF), potassium hydroxide (KOH), ammonia, hydrofluoric acid (HF), nitric acid ($HNO_3$), and/or acetic acid ($CH_3COOH$), other suitable wet etching etchant, or a combination thereof. Therefore, as shown in FIG. 1C, the upper sub-collector layer 104B may have a tapered sidewall 104S which is not perpendicular to the bottom surface of the upper sub-collector layer 104B.

It should be noted that the shape of the upper sub-collector layer 104B is merely an example and the upper sub-collector layer 104B in the present embodiment is not limited thereto. The etching of the upper sub-collector layer 104B may also be an anisotropic process and therefore the upper sub-collector layer 104B may have a straight sidewall 104S.

Next, as shown in FIG. 1C, base electrodes 119 are formed on the top surface of the base layer 110. The processes for forming the base electrodes 119 may be the same as, or similar to, those used to form the emitter electrode 116. For the purpose of brevity, the descriptions of these processes are not repeated herein.

Figure 1D:
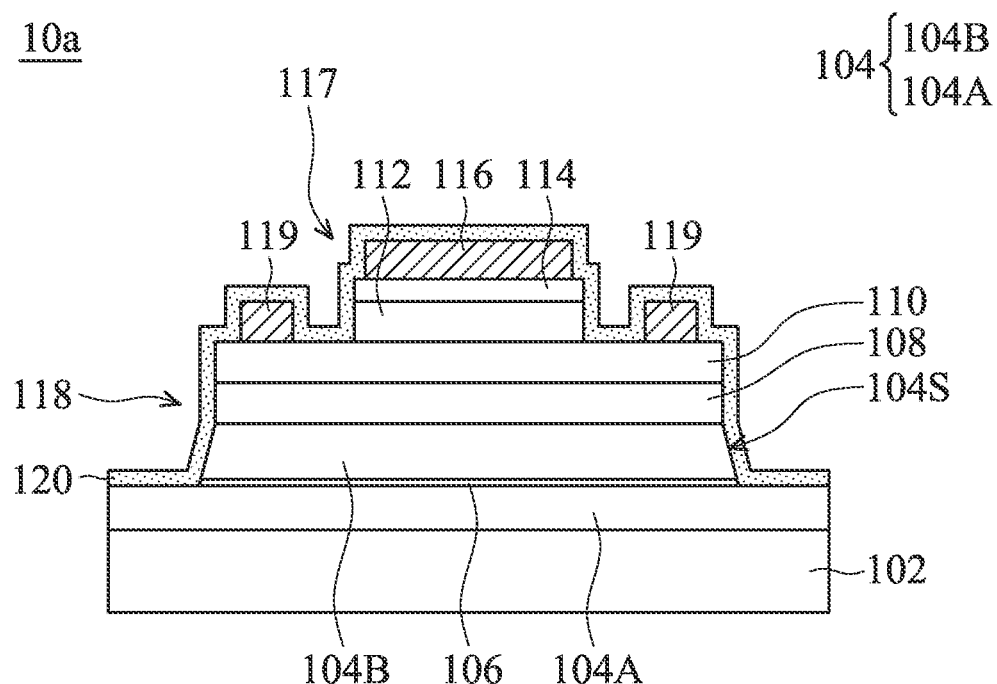

Next, as shown in FIG. 1D, a passivation layer 120 is formed covering the bottom sub-collector layer 104A, the upper sub-collector layer 104B, the collector layer 108, the base layer 110, the emitter layer 112, and the emitter cap layer 114. In some embodiments, the passivation layer 120 covers the base mesa 118 and the emitter mesa 117. The passivation layer 120 may include $SiN_3$, $SiO_2$, SiON, $Al_2O_3$, AN, polyimide (PI), benzocyclobutene (BCB), or polybenzoxazole (PBO), other insulating materials, or a combination thereof. In some embodiments, the passivation layer 120 includes $SiN_3$. The passivation layer 120 may be formed by metalorganic chemical vapor deposition (MOCVD), chemical vapor deposition (CVD), spin-coating, another suitable method, or a combination thereof. In some embodiments, the passivation layer 120 is conformally formed on the bottom sub-collector layer 104A, the upper sub-collector layer 104B, the collector layer 108, the base layer 110, the emitter layer 112, and the emitter cap layer 114. The passivation layer 120 may protect the layers below, and provide physical isolation and structure support.

Figure 1E:
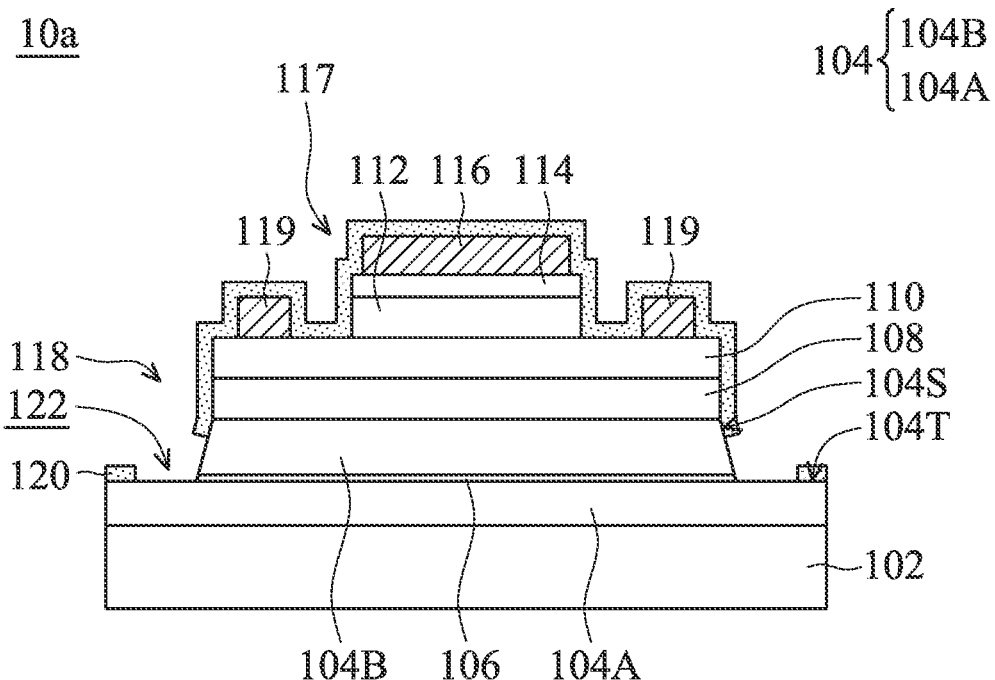

Next, as shown in FIG. 1E, openings 122 are formed in the passivation layer 120 exposing a portion of the sidewall 104S of the upper sub-collector layer 104B and the top surface 104T of the bottom sub-collector layer 104A. As shown in FIG. 1E, after the openings 122 are formed in the passivation layer 120, the passivation layer 120 covers a top portion of the sidewall of the base mesa 118. The openings 122 may be formed in the passivation layer 120 by a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Figure 1F:
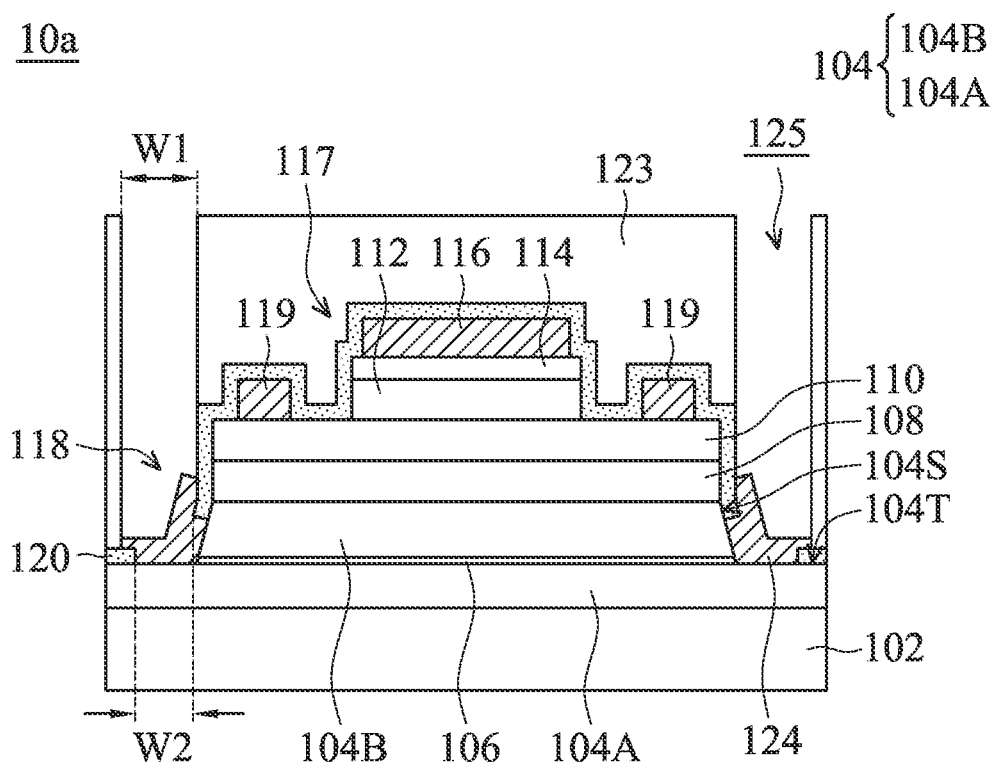

Next, as shown in FIG. 1F, a mask layer 123 is formed over the passivation layer 120, the bottom sub-collector layer 104A, the upper sub-collector layer 104B, the collector layer 108, the base layer 110, the emitter layer 112, and the emitter cap layer 114. Afterwards, openings 125 are formed in the mask layer 123 exposing a portion of the passivation layer 120, a portion of the sidewall 104S of the upper sub-collector layer 104B, and the top surface 104T of the bottom sub-collector layer 104A. As shown in FIG. 1F, the opening 125 in the mask layer 123 has a width W1, and the opening 122 in the passivation layer 120 has a width W2. In some embodiments, the width W1 of the opening 125 is greater than the width W2 of the opening 122. The openings 125 may be formed in the mask layer 123 by a lithography process, an etching process, other applicable processes, or a combination thereof.

Figure 1G:
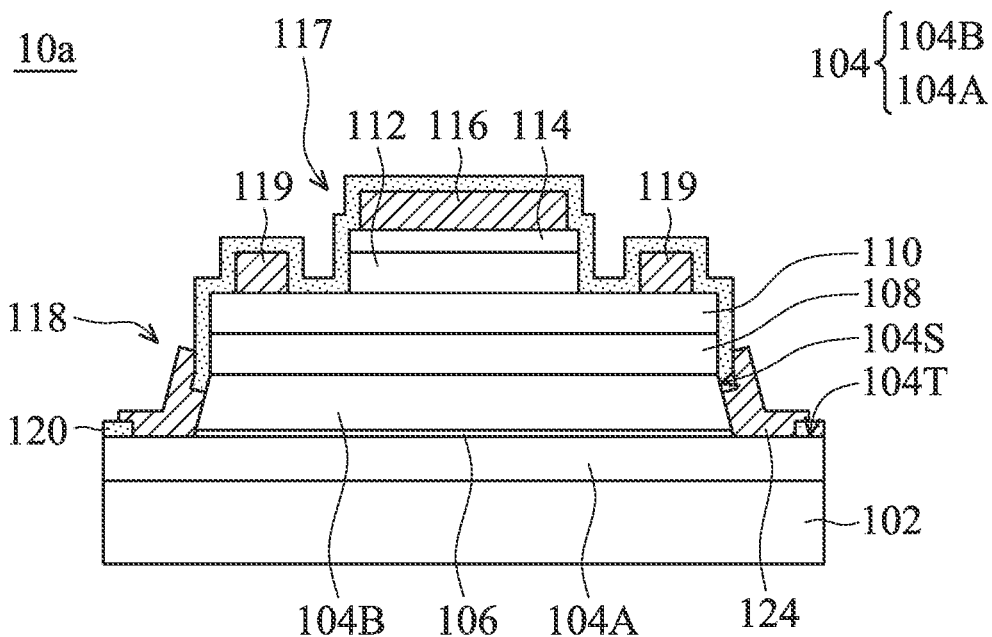

Next, collector electrodes 124 are formed in the openings 122, and the mask layer 123 is removed, as shown in FIGS. 1F and 1G. The collector electrodes 124 may include conductive material such as Ti, Al, Au, Pd, Pt, Cu, W, other suitable metal, its alloy, or a combination thereof. The processes for forming the collector electrodes 124 may be the same as, or similar to, those used to form the emitter electrode 116. For the purpose of brevity, the descriptions of these processes are not repeated herein. Since the openings 122 exposes the sidewall 104S of the upper sub-collector layer 104B and the top surface 104T of the bottom sub-collector layer 104A, the collector electrodes 124 is directly on the sidewall 104S of the upper sub-collector layer 104B and the top surface 104T of the bottom sub-collector layer 104A. The collector electrodes 124 may have a flat bottom surface over the bottom sub-collector layer 104A.

As described above, the upper sub-collector layer 104B and the bottom sub-collector layer 104A may be highly doped with a doping concentration of in a range of between 1e18 cm$^{-3}$ to 1e20 cm$^{-3}$. Therefore, an ohmic contact may be formed between the collector electrodes 124 and the upper sub-collector layer 104B. In addition, an ohmic contact may also be formed between the collector electrodes 124 and the bottom sub-collector layer 104A. With such a large ohmic contact area, the collector resistance may be reduced.

As shown in FIG. 1F, since the width W1 of the opening 125 in the mask layer 123 is greater than the width W2 of the opening 122 in the passivation layer 120, the collector electrodes 124 covers a portion of the passivation layer 120. In some embodiments, the collector electrodes 124 covers a portion of the passivation layer 120 over the sidewall 104S of the upper sub-collector layer 104B. The collector electrodes 124 may also cover a portion of the passivation layer 120 that is over the top surface 104T of the bottom sub-collector layer 104A and laterally spaced apart from the sidewall 104S of the upper sub-collector layer 104B. In addition, since the width W1 of the opening 125 in the mask layer 123 is greater than the width W2 of the opening 122 in the passivation layer 120, it may be easier to control the contact area of the collector electrodes 124, and the uniformity may be improved and the risk of misalignment may be reduced.

By forming the collector electrodes 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment.

Figure 2A:
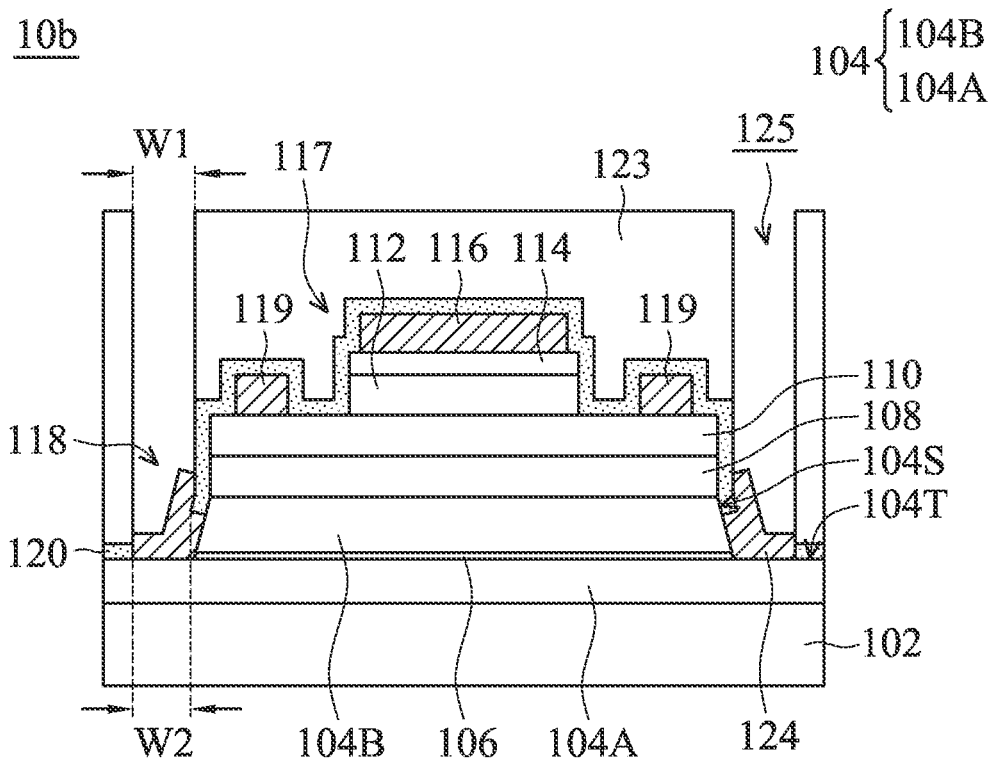
FIGS. 2A-2B are cross-sectional representations of various stages of forming a heterojunction bipolar transistor in accordance with some other embodiments.
Figure 2B:
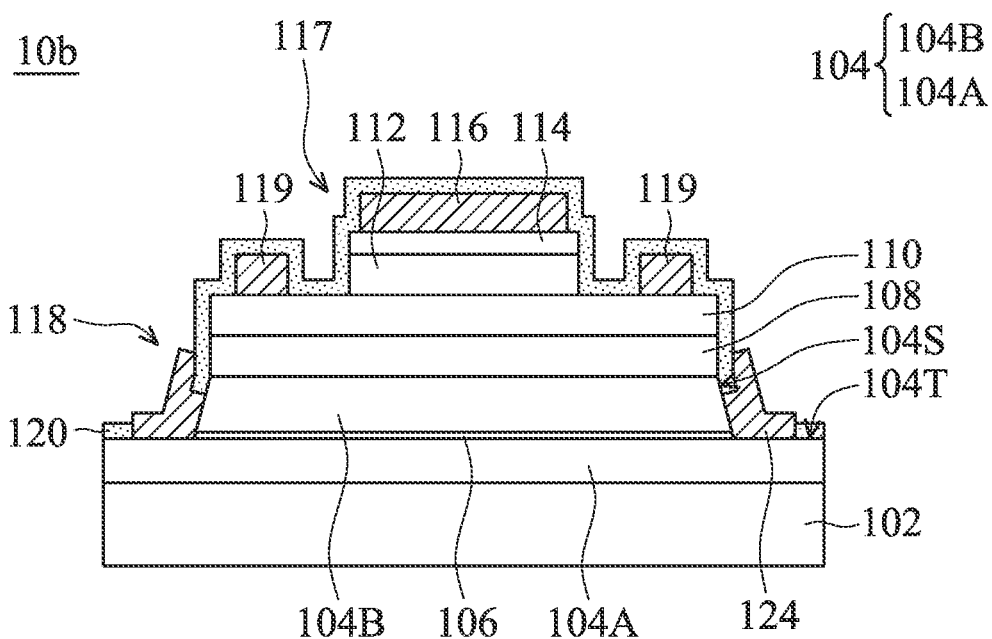

Many variations and/or modifications may be made to the embodiments of the disclosure. FIGS. 2A-2B are cross-sectional representations of various stages of forming a heterojunction bipolar transistor 10b in accordance with some other embodiments. Some processes or devices are the same as, or similar to, those described in the embodiments above, and therefore the descriptions of these processes and devices are not repeated herein. The difference from the embodiments described above is that, as shown in FIG. 2A in accordance with some other embodiments, the sidewall of the collector electrode 124 is aligned with the sidewall of the passivation layer 120 laterally spaced apart from the upper sub-collector layer 104B.

As shown in FIG. 2A, the mask layer 123 covers the passivation layer 120 laterally spaced apart from the upper sub-collector layer 104B, and the passivation layer 120 over the sidewall 104S of the upper sub-collector layer 104B is exposed from the opening 125 of the mask layer 123. The width W1 of the opening 125 in the mask layer 123 is greater than the width W2 of the opening 122 in the passivation layer 120. Therefore, the collector electrode 124 formed in the openings 125 may cover the portion of the passivation layer 120 over the sidewall 104S of the upper sub-collector layer 104B, and the sidewall of the collector electrode 124 may be aligned with sidewall of the passivation layer 120 laterally spaced apart from the upper sub-collector layer 104B.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, preventing the passivation layer 120 from peeling. It may also be easier to form the collector electrode 124 in the opening 122 in the passivation layer 120 with a greater opening 125 of the mask layer 123, and preventing misalignment. The opening 125 may have a sidewall aligned with the sidewall of the passivation layer 120 laterally spaced apart from the upper sub-collector layer 104B.

Figure 3A:
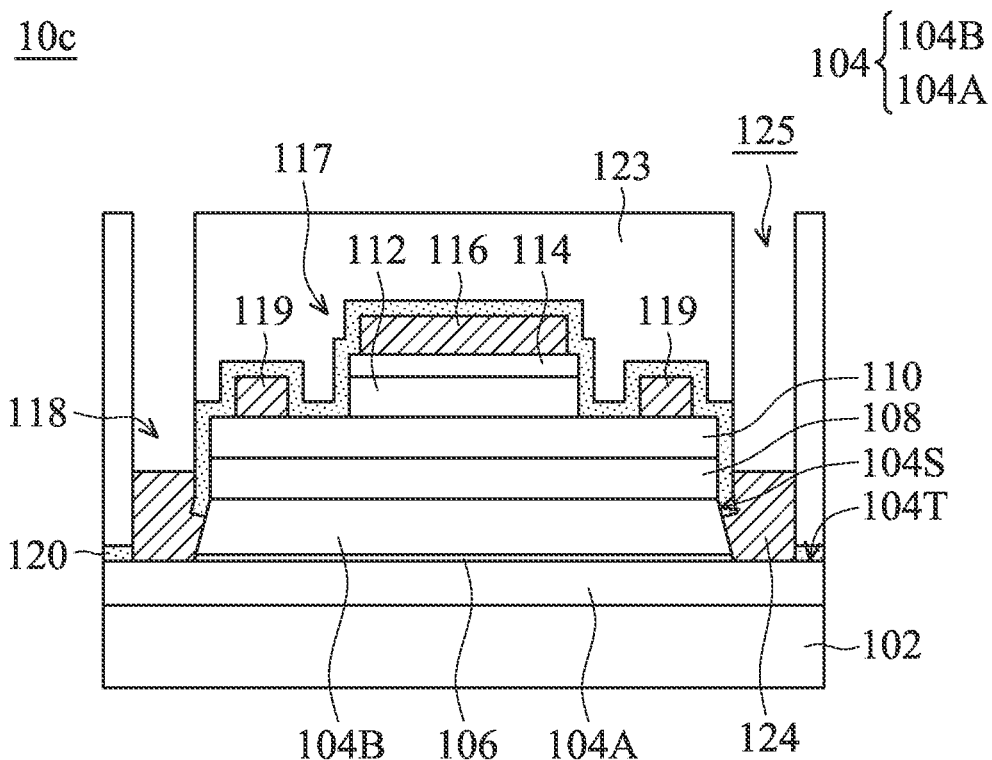
FIGS. 3A-3B are cross-sectional representations of various stages of forming a heterojunction bipolar transistor in accordance with some further embodiments.
Figure 3B:
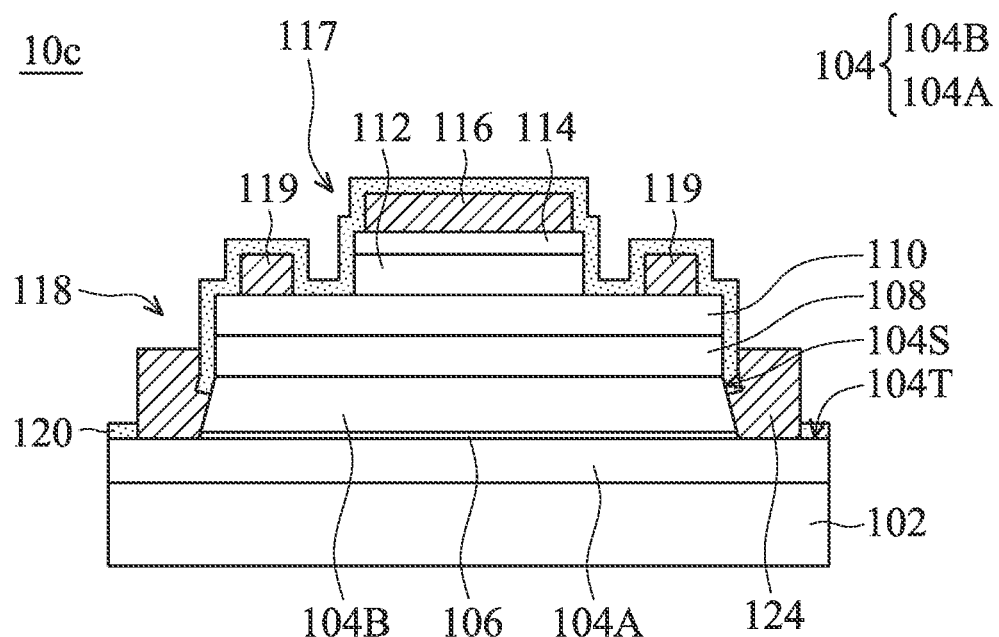

Many variations and/or modifications may be made to the embodiments of the disclosure. FIGS. 3A-3B are cross-sectional representations of various stages of forming a heterojunction bipolar transistor 10c in accordance with some other embodiments. Some processes or devices are the same as, or similar to, those described in the embodiments above, and therefore the descriptions of these processes and devices are not repeated herein. The difference from the embodiments described above is that, as shown in FIG. 3A in accordance with some other embodiments, the collector electrode 124 has a top surface parallel with the bottom surface of the base mesa 118.

As shown in FIG. 3A, the material of the collector electrode 124 is deposited in the opening 125 of the mask layer 123 until the top surface of the collector electrode 124 is parallel with the bottom surface of the base mesa 118. After removing the mask layer 123 as shown in FIG. 3B, the collector electrode 124 covers the passivation layer 120 over the sidewall of the base mesa 118, and the top surface of the collector electrode 124 is higher than a bottom surface of the collector layer 108. In addition, the top surface of the collector electrode 124 is lower than a top surface of the collector layer 108. Therefore, the passivation layer 120 may provide isolation between the collector electrode 124 and the collector layer 108, and unwanted Schottky contact may be prevented.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment. With a top surface of the collector electrode 124 higher than a bottom surface of the collector layer 108 and parallel to the bottom surface of the base mesa 118, the passivation layer 120 may provide isolation between the collector electrode 124 and the collector layer 108. In addition, the current handling and/or the thermal dissipation may be improved.

Figure 4:
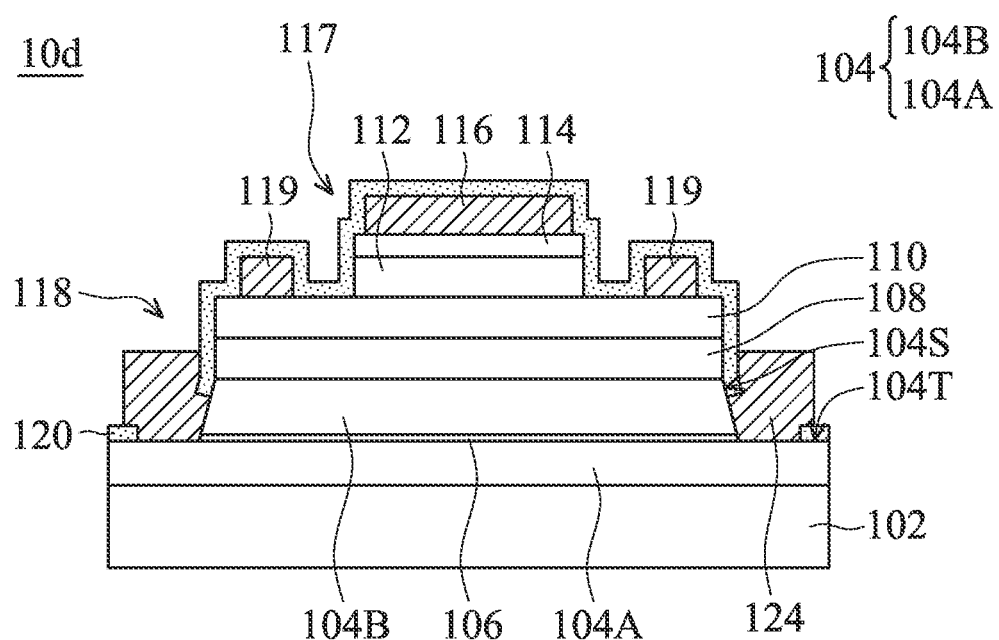
FIG. 4 is a cross-sectional representation of a heterojunction bipolar transistor in accordance with some further embodiments.

Many variations and/or modifications may be made to the embodiments of the disclosure. FIG. 4 is a cross-sectional representation of a heterojunction bipolar transistor 10d in accordance with some other embodiments. Some processes or devices are the same as, or similar to, those described in the embodiments above, and therefore the descriptions of these processes and devices are not repeated herein. The difference from the embodiments described above is that, as shown in FIG. 4 in accordance with some other embodiments, the collector electrode 124 has a top surface parallel with the bottom surface of the base mesa 118 and covers a portion of the passivation layer 120 laterally spaced apart from the upper sub-collector layer 104B.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, there may be less risk of peeling the passivation layer 120. It may also be easier to form the collector electrode 124 in the opening 122 in the passivation layer 120 with a greater opening 125 of the mask layer 123, and preventing misalignment. With a top surface of the collector electrode 124 higher than a bottom surface of the collector layer 108 and parallel to the bottom surface of the base mesa 118, the passivation layer 120 may provide isolation between the collector electrode 124 and the collector layer 108. With an opening 125 greater than the opening 122 of the passivation layer 120, the portion of the passivation layer 120 laterally spaced apart from the upper sub-collector layer 104B may be covered by the collector electrode 124, and the misalignment issue may be further prevented.

Figure 5:
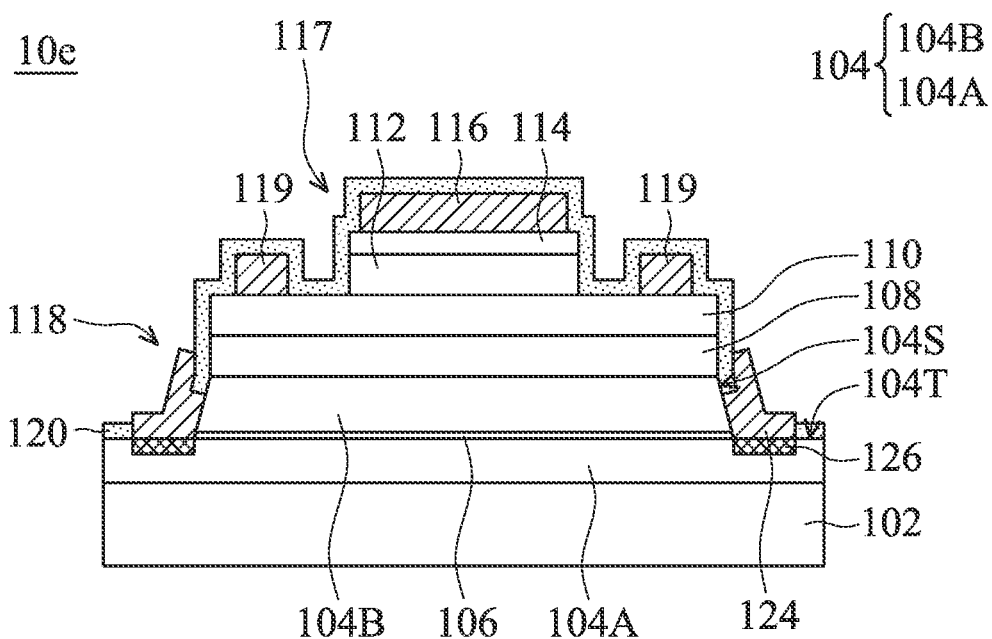
FIG. 5 is a cross-sectional representation of a heterojunction bipolar transistor in accordance with some further embodiments.

Many variations and/or modifications may be made to the embodiments of the disclosure. FIG. 5 is a cross-sectional representation of a heterojunction bipolar transistor 10e in accordance with some other embodiments. Some processes or devices are the same as, or similar to, those described in the embodiments above, and therefore the descriptions of these processes and devices are not repeated herein. The difference from the embodiments described above is that, as shown in FIG. 5 in accordance with some embodiments, an alloy layer 126 is formed in the bottom sub-collector layer 104A below the collector electrode 124.

In some embodiments as shown in FIG. 5, the alloy layer 126 is grown in the bottom sub-collector layer 104A exposed from the opening 122 in the passivation layer 120. Afterwards, the collector electrode 124 is formed over the alloy layer 126 and covers a portion of the passivation layer 120. In some embodiments, the alloy layer 126 is in contact with the collector electrode 124. In some embodiments, the alloy layer 126 includes a low bandgap alloy which has a bandgap lower than the bandgap of the bottom sub-collector layer 104A. The alloy layer 126 may include alloy such as InAs or InGaAs. The alloy layer 126 under the collector electrode 124 may reduce the lattice mismatch issue.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, it may peel less. It may also be easier to form the collector electrode 124 in the opening 122 in the passivation layer 120 with a greater opening 125 of the mask layer 123, and preventing misalignment. With an alloy layer 126 formed under the collector electrode 124, lattice mismatch may be prevented.

Figure 6:
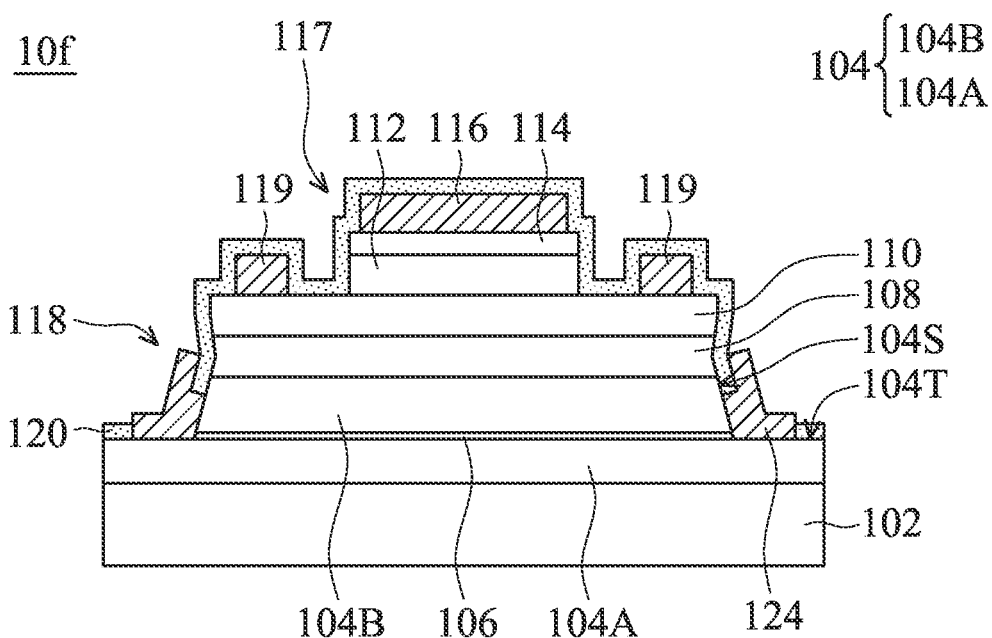
FIG. 6 is a cross-sectional representation of a heterojunction bipolar transistor in accordance with some further embodiments.

Many variations and/or modifications may be made to the embodiments of the disclosure. FIG. 6 is a cross-sectional representation of a heterojunction bipolar transistor 10f in accordance with some other embodiments. Some processes or devices are the same as, or similar to, those described in the embodiments above, and therefore the descriptions of these processes and devices are not repeated herein. The difference from the embodiments described above is that, as shown in FIG. 6 in accordance with some embodiments, the collector layer 108 is etched laterally.

As shown in FIG. 6, when forming base mesa 118, a dry etching process is performed first and then a wet etching process is performed. Therefore, the collector layer 108 is etched laterally. Therefore, the minimum width of the collector layer 108 is less than the minimum width of the base layer 110. In some embodiments, the collector layer 108 has a lateral recess. In some embodiments, the base mesa 118 includes an undercut profile with a neck between the top surface and the bottom surface of the collector layer 108, as shown in FIG. 6. Since the collector layer 108 is etched laterally, the collector electrode 124 may be more close to the base electrode 119 and the emitter electrode 116, and the resistance may be reduced further.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment. With the collector layer 108 being etched laterally, the resistance may be reduced further.

Figure 7:
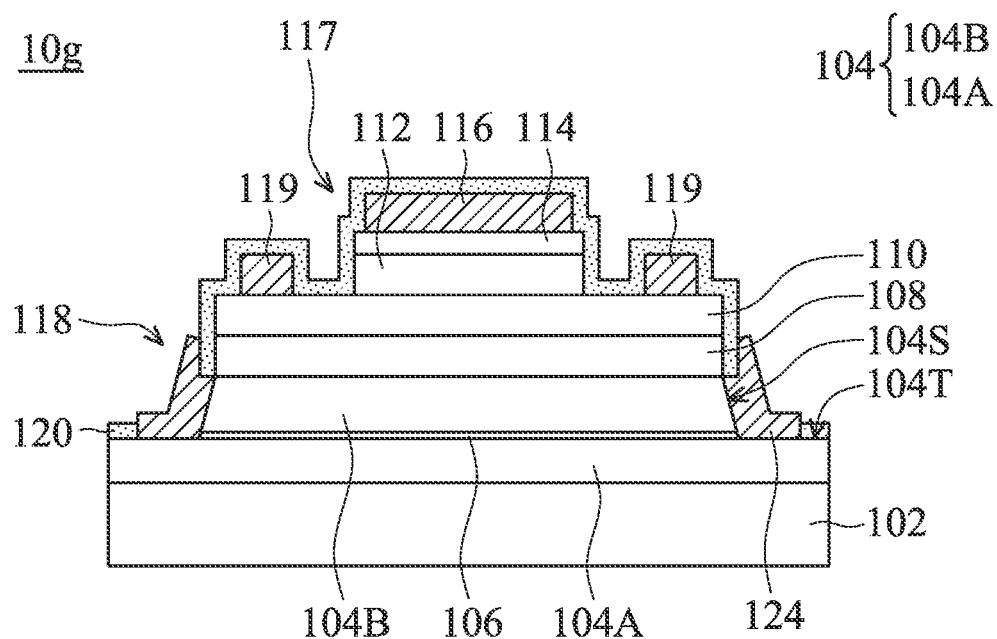
FIG. 7 is a cross-sectional representation of a heterojunction bipolar transistor in accordance with some further embodiments.

Many variations and/or modifications may be made to the embodiments of the disclosure. FIG. 7 is a cross-sectional representation of a heterojunction bipolar transistor 10g in accordance with some other embodiments. Some processes or devices are the same as, or similar to, those described in the embodiments above, and therefore the descriptions of these processes and devices are not repeated herein. The difference from the embodiments described above is that, as shown in FIG. 7 in accordance with some embodiments, the bottom surface of the passivation layer 120 over the sidewall 104S of the base mesa 118 is level with a bottom surface of the collector layer 108.

In some embodiments, the opening 122 exposes the sidewall of the top sub-collector 104B, but not exposes the sidewall of the collector layer 108. Therefore, the collector electrode 124 is separated from the collector layer 108 by the passivation layer 120, and unwanted Schottky contact can be prevented.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment. The bottom surface of the passivation layer 120 over the sidewall 104S of the base mesa 118 is level with a bottom surface of the collector layer 108. Therefore, unwanted Schottky contact can be prevented.

Figure 8:
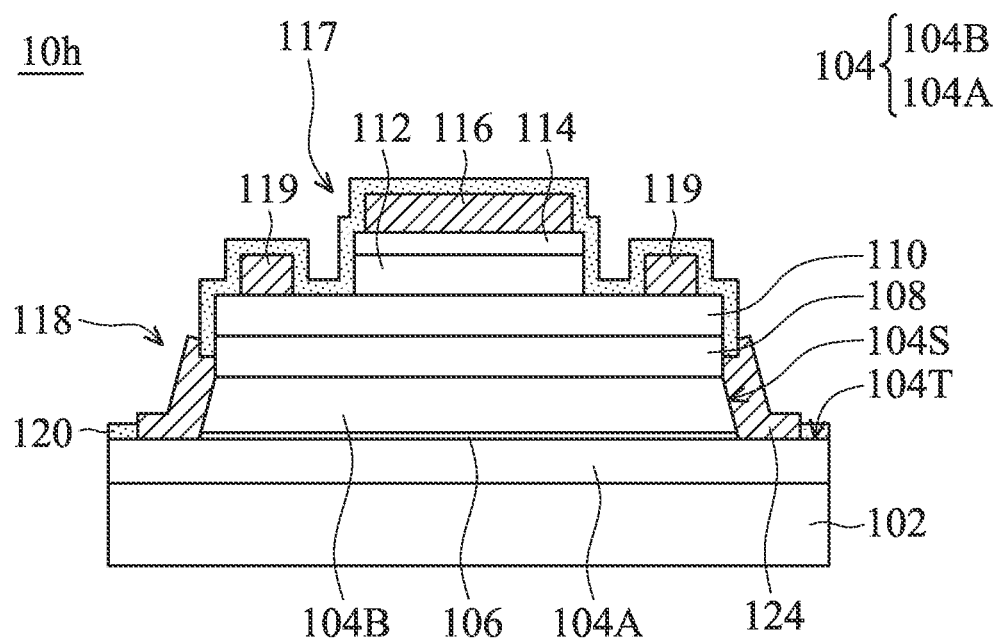
FIG. 8 is a cross-sectional representation of a heterojunction bipolar transistor in accordance with some further embodiments.

Many variations and/or modifications may be made to the embodiments of the disclosure. FIG. 8 is a cross-sectional representation of a heterojunction bipolar transistor 10h in accordance with some other embodiments. Some processes or devices are the same as, or similar to, those described in the embodiments above, and therefore the descriptions of these processes and devices are not repeated herein. The difference from the embodiments described above is that, as shown in FIG. 8 in accordance with some embodiments, the passivation layer 120 partially covers the sidewall of the collector layer 108.

In some embodiments, the opening 122 expose the sidewall 104S of the top sub-collector 104B and a portion of the sidewall of the collector layer 108. Therefore, a portion of the collector electrode 124 is separated from the collector layer 108 by the passivation layer 120. The effect of unwanted Schottky contact may be reduced since the collector electrode 124 covers a portion of the passivation layer 120.

By forming the collector electrode 124 covering a portion of the passivation layer 120 over the sidewall 104S of the upper sub-collector layer 104B, the collector electrode 124 may be separated from the collector layer 108 by a portion of the passivation layer 120, and the effect of unwanted Schottky contact may be reduced. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment.

Figure 9A:
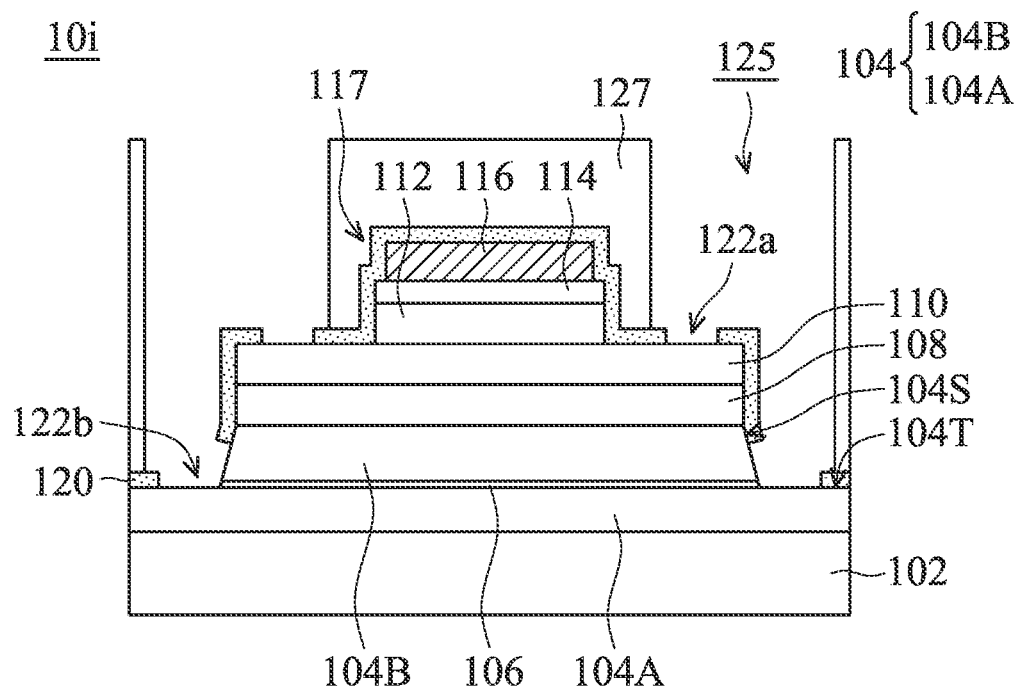
FIGS. 9A-9C are cross-sectional representations of various stages of forming a heterojunction bipolar transistor in accordance with some further embodiments.
Figure 9B:
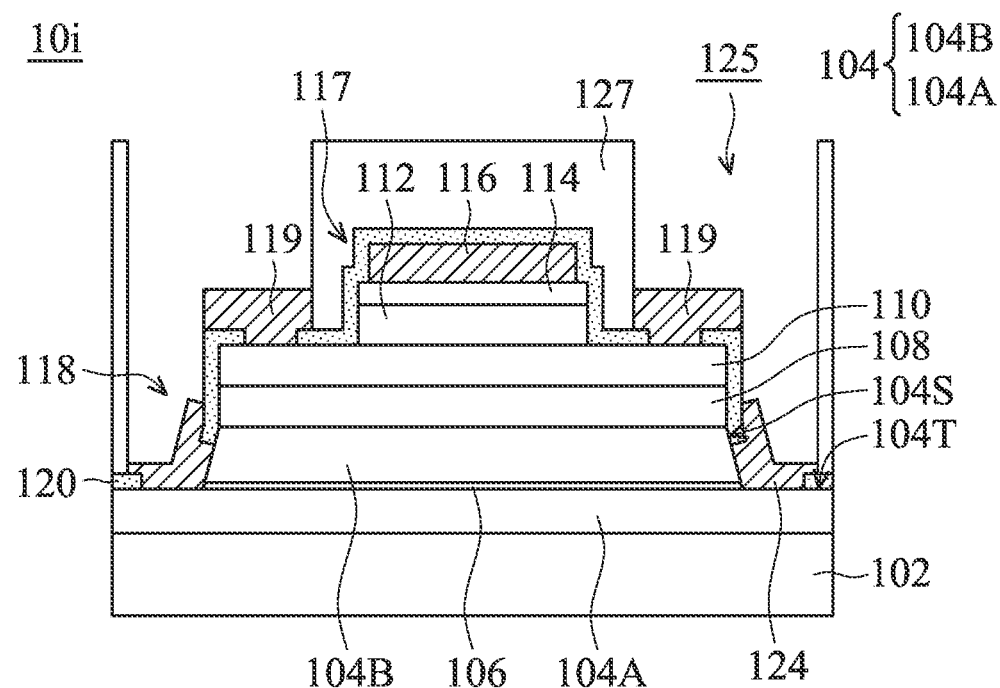
Figure 9C:
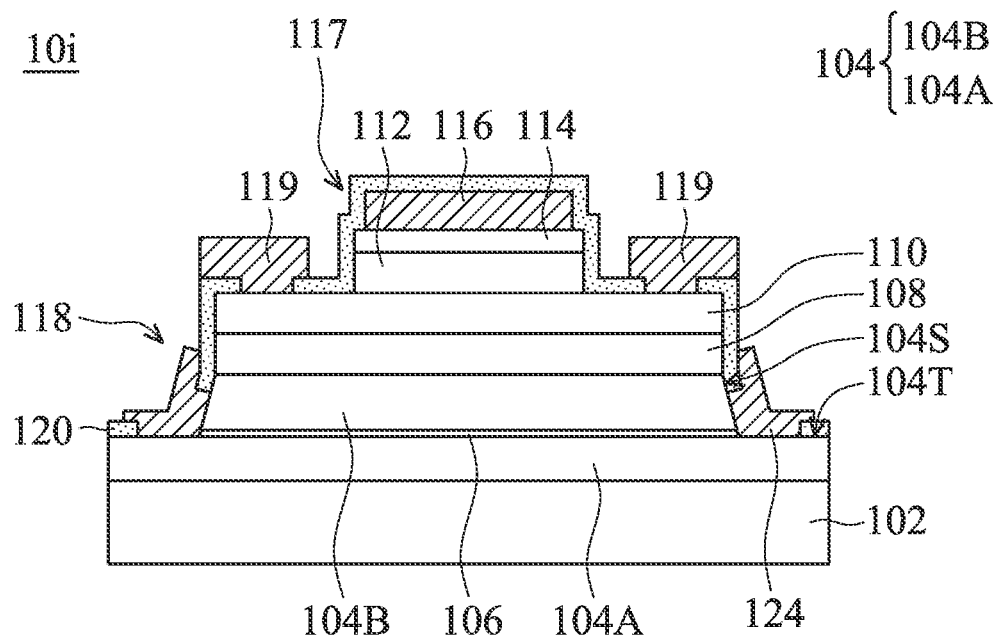

Many variations and/or modifications may be made to the embodiments of the disclosure. FIGS. 9A-9C are cross-sectional representations of various stages of forming a heterojunction bipolar transistor 10i in accordance with some other embodiments. Some processes or devices are the same as, or similar to, those described in the embodiments above, and therefore the descriptions of these processes and devices are not repeated herein. The difference from the embodiments described above is that, as shown in FIG. 9A in accordance with some embodiments, the base electrode 119 and the collector electrode 124 are formed with the same mask layer 127.

In some embodiments as shown in FIG. 9A, the opening 122 in the passivation layer 120 including an opening 122a exposing the top surface of the base layer 110, and an opening 122b exposing the sidewall 104S of the upper sub-collector 104B and the top surface of the bottom sub-collector 104A. As shown in FIG. 9A, the opening 125 is formed in the mask layer 127 exposing the top surface of the base layer 110, the sidewall of the base mesa 118, and the top surface of the bottom sub-collector layer 104A. In some embodiments, the openings 122a and 122b in the passivation layer 120 are exposed in the openings 125 in the mask layer 127.

Next, in some embodiments, a conductive material is conformally formed in the openings 125 in the mask layer 127, and the base electrode 119 is self-aligned formed over the top surface of base layer 120, and the collector electrode 124 is self-aligned formed over the sidewall 104S of the upper sub-collector layer 104B and the top surface 104T of the bottom sub-collector layer 104A. After the mask layer 127 is removed as shown in FIG. 9C, the base electrode 119 covers a portion of the passivation layer 120 between the base electrode 119 and the collector electrode 124. In some embodiments, the base electrode 119 covers a portion of the passivation layer 120 over the base mesa 118.

In some embodiments, as shown in FIG. 9C, the base electrode 119 and the collector electrode 124 are separated by the passivation layer 120, the base electrode 119 and the collector electrode 124 are self-aligned formed, preventing short-circuit issue. Moreover, since only one mask 127 is needed when forming the base electrode 119 and the collector electrode 124, the production time and cost may be saved.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment. The base electrode 119 and the collector electrode 124 may be self-aligned formed with the same mask 127. Therefore, the production time and cost may be saved, and the short-circuit issue may be prevented.

Figure 10A:
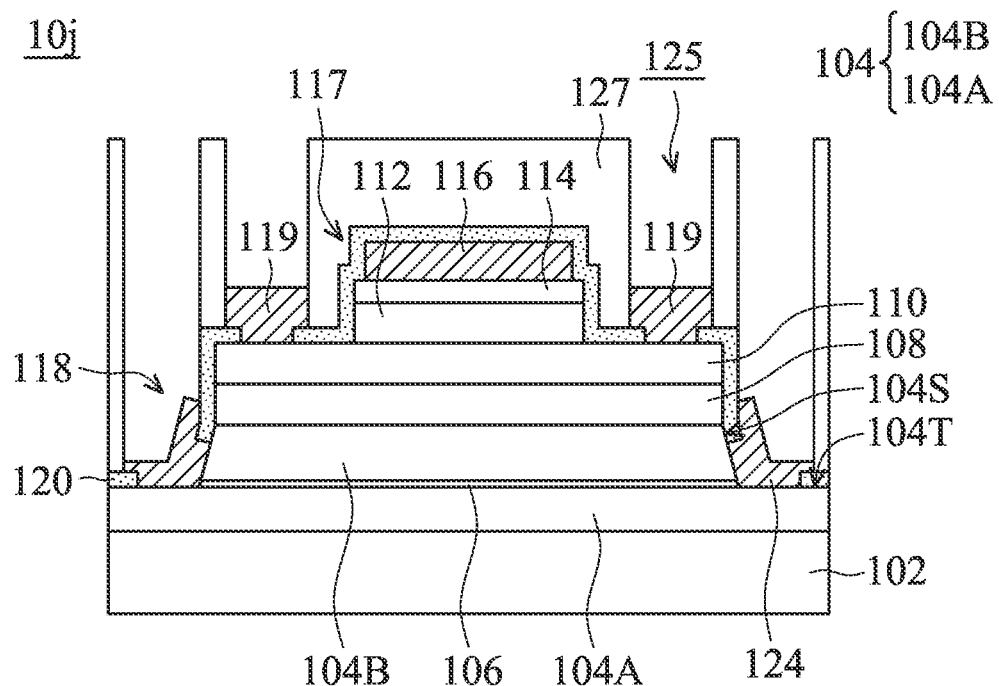
FIGS. 10A-10B are cross-sectional representations of various stages of forming a heterojunction bipolar transistor in accordance with some further embodiments.
Figure 10B:
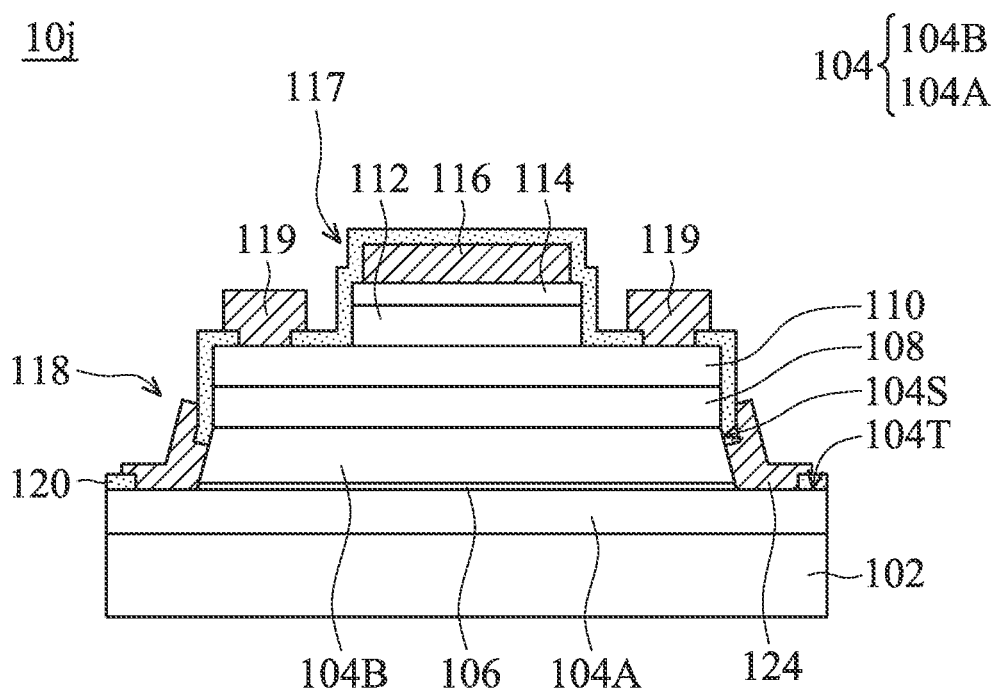

Many variations and/or modifications may be made to the embodiments of the disclosure. FIGS. 10A-10B are cross-sectional representations of various stages of forming a heterojunction bipolar transistor 10j in accordance with some other embodiments. Some processes or devices are the same as, or similar to, those described in the embodiments above, and therefore the descriptions of these processes and devices are not repeated herein. The difference from the embodiments described above is that, as shown in FIG. 10A in accordance with some embodiments, the mask layer 127 is formed between the openings 122 over the top surface and the sidewall of the base mesa 118.

As shown in FIG. 10A, the openings 125 in the mask layer 127 are separated by the mask layer 127. Next, a conductive material is conformally formed in the openings 125 in the mask layer 127, and the base electrode 119 and the collector electrode 124 are formed over the top surface of base layer 120 and over the sidewall 104S of the upper sub-collector layer 104B, respectively. After the mask layer 127 is removed as shown in FIG. 10B, the base electrode 119 covers a portion of the passivation layer 120 over the base mesa 118. In some embodiments, a top surface of the base electrode 119 is wider than a bottom surface of the base electrode 119. In some embodiments, the base electrode 119 has a T-shape in a cross-sectional view.

Since the mask layer 127 is formed between the base electrode 119 and the collector electrode 124 as shown in FIG. 10A, the base electrode 119 and the collector electrode 124 are separated from each other in a top view. Therefore, the risk of short-circuit issue may be reduced further.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment. The base electrode 119 and the collector electrode 124 may be formed separated from each other with the same mask 127. Therefore, the production time and cost may be saved, and the short-circuit issue may be further prevented.

Figure 11:
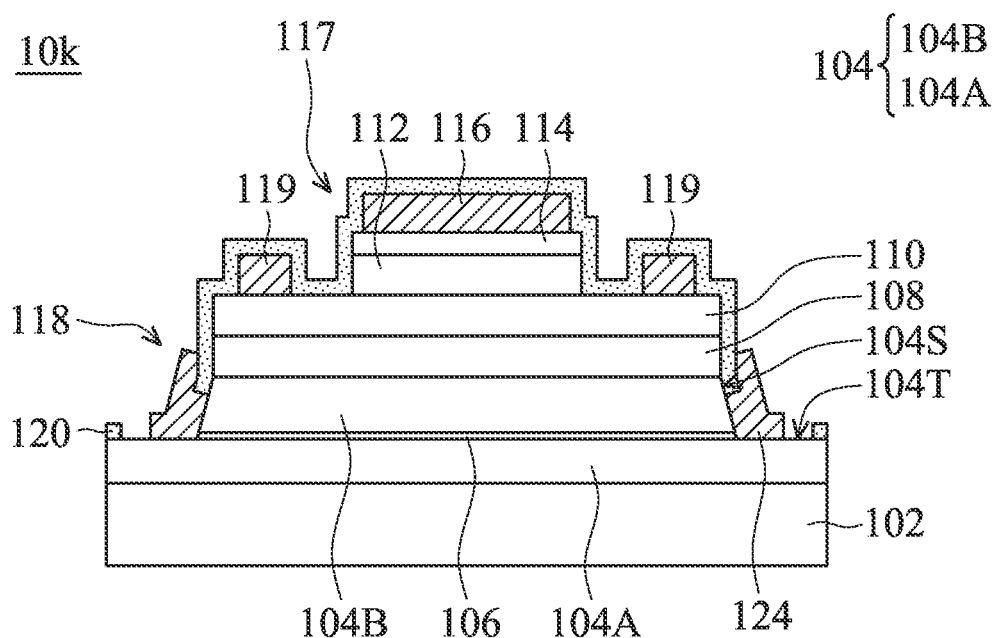
FIG. 11 is a cross-sectional representation of a heterojunction bipolar transistor in accordance with some further embodiments.

Many variations and/or modifications may be made to the embodiments of the disclosure. FIG. 11 is a cross-sectional representation of a heterojunction bipolar transistor 10k in accordance with some other embodiments. Some processes or devices are the same as, or similar to, those described in the embodiments above, and therefore the descriptions of these processes and devices are not repeated herein. The difference from the embodiments described above is that, as shown in FIG. 11 in accordance with some embodiments, the passivation layer 120 over the top surface 104T of the bottom sub-collector layer 104A is separated from the collector electrode 124.

As shown in FIG. 11, the mask 123 is formed in the opening 122 covering a portion of the top surface 104T of the bottom sub-collector layer 104A. Therefore, the collector electrode 124 formed in the opening 125 is separated from the passivation layer 120 over the top surface 104T of the bottom sub-collector layer 104A.

By forming the collector electrode 124 covering a portion of the passivation layer 120 over the sidewall 104S of the upper sub-collector layer 104B, the collector electrode 124 may be separated from the collector layer 108 by the passivation layer 120, and unwanted Schottky contact can be prevented. In addition, with the collector electrode 124 covering a portion of the passivation layer 120, the passivation layer 120 may peel less. It may also be easier to form the collector electrode 124 in the opening 122 in the passivation layer 120 with a greater opening 125 of the mask layer 123, and preventing misalignment. The collector electrode 124 may be separated from the passivation layer 120 over the top surface 104T of the bottom sub-collector layer 104A.

Figure 12A:
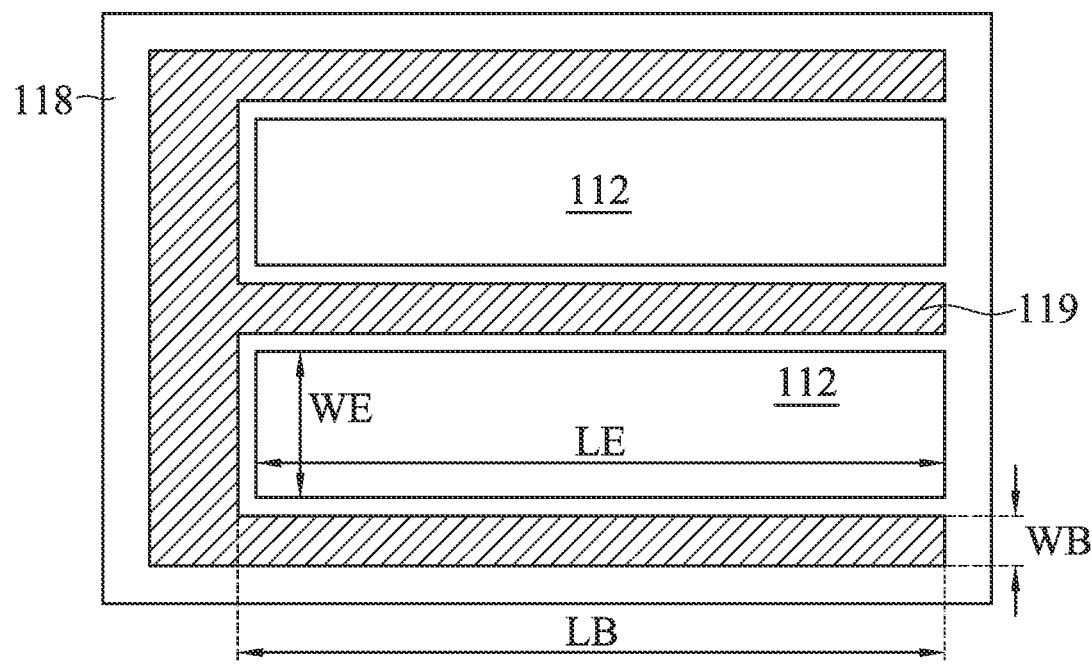
FIGS. 12A-12B, 13 are top views of a heterojunction bipolar transistor in accordance with some further embodiments.
Figure 12B:
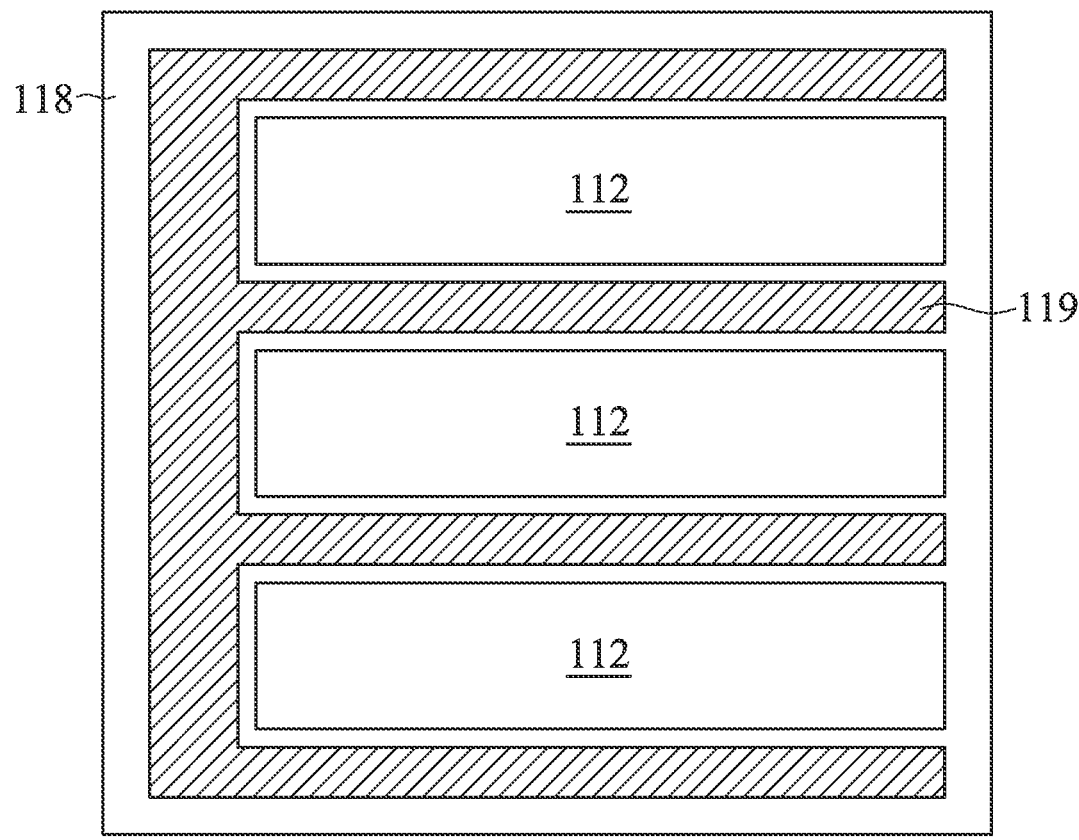
Figure 13:
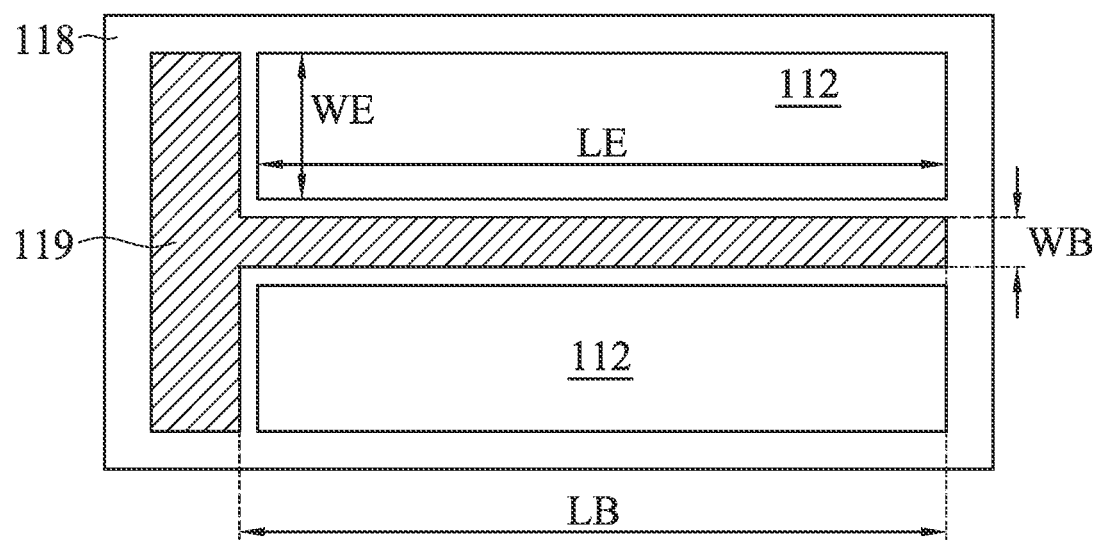

FIG. 12A-12B, 13 are top views of a heterojunction bipolar transistor in accordance with some further embodiments. As shown in FIGS. 12A and 12B, the base electrode 119 has a comb-like shape in a top view, and the emitter layer 112 is inserted between the teeth of the base electrode 119. The shape of the heterojunction bipolar transistor in the top view as shown in FIGS. 12A and 12B is base-emitter-base (BEB) type.

In some embodiments as shown in FIGS. 12A and 12B, the base electrode 119 has a width WB in a range of about 0.1 µm to about 4 and the base electrode 119 has a length LB in a range of about 2 µm to about 100 µm. In some embodiments, the emitter layer 112 has a width WE in a range of about 0.5 µm to about 6 µm, and the emitter layer 112 has a length LB in a range of about 2 µm to about 100 µm. In some embodiments, the emitter layer 112 has between 1 and 4 fingers. The dimension of the base electrode 119 and the emitter layer 112 may be adjusted to improve the performance of the heterojunction bipolar transistor. The base electrode 119 may have one more finger than the emitter layer 112.

In some embodiments, as shown in FIG. 13, the base electrode 119 has a T-shape in a top view, and the emitter layer 112 is disposed beside the base electrode 119. The shape of the heterojunction bipolar transistor in the top view as shown in FIG. 13 is emitter-base-emitter (EBE) type.

In some embodiments as shown in FIG. 13, the base electrode 119 has a width WB in a range of about 0.1 µm to about 4 µm, and the base electrode 119 has a length LB in a range of about 2 µm to about 100 µm. In some embodiments, the emitter layer 112 has a width WE in a range of about 0.5 µm to about 6 µm, and the emitter layer 112 has a length LB in a range of about 2 µm to about 100 µm. The dimension of the base electrode 119 and the emitter layer 112 may be adjusted to improve the performance of the heterojunction bipolar transistor. In some embodiments, the emitter layer 112 has between 1 and 4 fingers. The number of fingers of the base electrode 119 may be one less than the number of fingers of the emitter layer 112.

As mentioned above, in the present disclosure, a heterojunction bipolar transistor and a method of forming a heterojunction bipolar transistor are provided. With the collector electrode formed over the passivation layer, the passivation layer peeling risk may be reduced. In addition, the misalignment risk may also be reduced. Moreover, unwanted Schottky contact may be prevented since the passivation layer is between the collector electrode and the collector layer. The position of the collector electrode may be controlled by the mask layer. The thickness of the collector electrode may also be controlled. A low band gap metal alloy may be formed under the collector electrode to reduce the risk of lattice mismatch and/or to reduce the contact resistance. The base electrode and the collector electrode may be formed by the same mask to save production time and cost.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heterojunction bipolar transistor, comprising:
    a bottom sub-collector layer formed over a substrate;
    an upper sub-collector layer formed over the bottom sub-collector layer;
    a collector layer formed over the upper sub-collector layer;
    a base layer formed over the collector layer;
    an emitter layer formed over the base layer;
    a passivation layer covering the bottom sub-collector layer, the upper sub-collector layer, the collector layer, the base layer, and the emitter layer; and
    a collector electrode covering a first portion of the passivation layer over a sidewall of the upper sub-collector layer.

2. The heterojunction bipolar transistor as claimed in claim 1, wherein the collector electrode covers a portion of a top surface of the passivation layer over a top surface of the bottom sub-collector layer.

3. The heterojunction bipolar transistor as claimed in claim 1, further comprising:
    an alloy layer formed in the bottom sub-collector layer below the collector electrode.

4. The heterojunction bipolar transistor as claimed in claim 1, wherein a minimum width of the collector layer is less than a minimum width of the base layer.

5. The heterojunction bipolar transistor as claimed in claim 1, wherein a second portion of the passivation layer is laterally spaced apart from the sidewall of the upper sub-collection layer and the collector electrode.

6. The heterojunction bipolar transistor as claimed in claim 1, wherein a sidewall of the collector electrode is substantially aligned with a sidewall of the passivation layer over the bottom sub-collector layer.

7. A heterojunction bipolar transistor, comprising:
a bottom sub-collector layer disposed on a substrate;
a first mesa disposed on the bottom sub-collector layer, wherein the first mesa comprises a base layer disposed on a collector layer;
a second mesa disposed on the first mesa, wherein the second mesa comprises an emitter layer;
a passivation layer covering the first mesa and the second mesa; and
a collector electrode penetrating through the passivation layer,
wherein the collector electrode covers the passivation layer on a sidewall of the first mesa.

8. The heterojunction bipolar transistor as claimed in claim 7, wherein the first mesa further comprises an upper sub-collector layer having a tapered sidewall.

9. The heterojunction bipolar transistor as claimed in claim 7, wherein the sidewall of the first mesa comprises a sidewall of the collector layer, and a portion of the passivation layer is sandwiched between the collector electrode and the sidewall of the collector layer.

10. The heterojunction bipolar transistor as claimed in claim 7, further comprising:
a base electrode disposed on the first mesa,
wherein the base electrode covers a portion of the passivation layer on the first mesa.

11. The heterojunction bipolar transistor as claimed in claim 10, wherein the base electrode comprises a T-shaped profile.

12. The heterojunction bipolar transistor as claimed in claim 7, further comprising:
a base electrode disposed on the first mesa, wherein the passivation layer comprises a portion, and a top of the portion of the passivation layer is sandwiched between the base electrode and a top surface of the first mesa.

13. The heterojunction bipolar transistor as claimed in claim 12, wherein a bottom of the portion of the passivation layer is sandwiched between the collector electrode and the sidewall of the first mesa.

14. A method for forming a heterojunction bipolar transistor, comprising:
forming a bottom sub-collector layer over a substrate;
forming an upper sub-collector layer over the bottom sub-collector layer;
forming a collector layer over the upper sub-collector layer;
forming a base layer over the collector layer;
forming an emitter layer over the base layer;
forming a passivation layer covering the bottom sub-collector layer, the upper sub-collector layer, the collector layer, the base layer, and the emitter layer; and
forming a collector electrode in contact with the bottom sub-collector layer and the upper sub-collector layer,
wherein the passivation layer over a sidewall of the upper sub-collector layer is inserted between the collector electrode and the sidewall of the upper sub-collector layer.

15. The method for forming a heterojunction bipolar transistor as claimed in claim 14, wherein the formation of the collector electrode comprises:
forming a mask layer covering the bottom sub-collector layer, the upper sub-collector layer, the collector layer, the base layer, and the emitter layer, wherein a second opening in the mask layer exposes a top surface of the bottom sub-collector layer and the sidewall of the upper sub-collector layer, and the second opening is in communication with a first opening formed in the passivation layer; and
depositing a first conductive material in the first opening and the second opening.

16. The method for forming a heterojunction bipolar transistor as claimed in claim 15, wherein a width of the second opening is greater than a width of the first opening.

17. The method for forming a heterojunction bipolar transistor as claimed in claim 15, wherein the second opening is further in communication with a third opening formed in the passivation layer on a top surface of the base layer.

18. The method for forming a heterojunction bipolar transistor as claimed in claim 17, further comprising:
forming a base electrode in the second opening and the third opening, wherein the base electrode covers a portion of the passivation layer between the base electrode and the collector electrode.

19. The method for forming a heterojunction bipolar transistor as claimed in claim 14, further comprising:
forming an alloy layer on the bottom sub-collector layer.

20. The method for forming a heterojunction bipolar transistor as claimed in claim 14, wherein the collector electrode is in contact with a top surface of the bottom sub-collector layer and a sidewall of the upper sub collector layer.

* * * * *